United States Patent
Liao et al.

(10) Patent No.: US 9,799,566 B1
(45) Date of Patent: Oct. 24, 2017

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Shun-Jang Liao, Taoyuan (TW); Shu-Hui Wang, Hsinchu (TW); Shih-Hsun Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/272,513

(22) Filed: Sep. 22, 2016

(51) Int. Cl.
*H01L 21/8238* (2006.01)
*H01L 21/3205* (2006.01)
*H01L 21/4763* (2006.01)
*H01L 21/8234* (2006.01)
*H01L 27/088* (2006.01)
*H01L 29/49* (2006.01)
*H01L 29/66* (2006.01)

(52) U.S. Cl.
CPC .......... *H01L 21/82345* (2013.01); *H01L 21/823431* (2013.01); *H01L 21/823456* (2013.01); *H01L 27/0886* (2013.01); *H01L 29/4966* (2013.01); *H01L 29/66545* (2013.01)

(58) Field of Classification Search
CPC ......... H01L 27/0886; H01L 21/823456; H01L 21/82345

USPC .......................................... 257/231, 201, 587
See application file for complete search history.

(56) References Cited

U.S. PATENT DOCUMENTS

| | | | |
|---|---|---|---|
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |
| 2008/0274598 A1* | 11/2008 | Ramin | H01L 21/28026 438/231 |
| 2009/0072274 A1* | 3/2009 | Knoefler | H01L 27/11573 257/204 |
| 2014/0282326 A1 | 9/2014 | Chen et al. | |
| 2017/0117187 A1* | 4/2017 | Ando | H01L 21/823807 |

\* cited by examiner

*Primary Examiner* — David S Blum
(74) *Attorney, Agent, or Firm* — McClure, Qualey & Rodack, LLP

(57) ABSTRACT

A semiconductor device includes a first semiconductor channel, a second semiconductor channel, a first gate stack and a second gate stack. The first gate stack is present on the first semiconductor channel. The first gate stack includes a first work function layer and a first interposing layer present between the first semiconductor channel and the first work function layer. The second gate stack is present on the second semiconductor channel. The second gate stack includes a second work function layer and a second interposing layer present between the second semiconductor channel and the second work function layer. The first interposing layer and the second interposing layer are different at least in tantalum nitride amount.

20 Claims, 14 Drawing Sheets

SEMICONDUCTOR DEVICE AND MANUFACTURING METHOD THEREOF

BACKGROUND

As the semiconductor industry has strived for higher device density, higher performance, and lower costs, problems involving both fabrication and design have been encountered. One solution to these problems has been the development of a fin-like field effect transistor (FinFET). A FinFET includes a thin vertical 'fin' formed by etching spaced recesses into a substrate. The source, drain, and channel regions are defined within this fin. The transistor's gate wraps around the channel region of the fin. This configuration allows the gate to induce current flow in the channel from three sides. Thus, FinFET devices have the benefit of higher current flow and reduced short-channel effects.

The dimensions of FinFETs and other metal oxide semiconductor field effect transistors (MOSFETs) have been progressively reduced as technological advances have been made in integrated circuit materials. For example, high-k metal gate (HKMG) processes have been applied to FinFETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
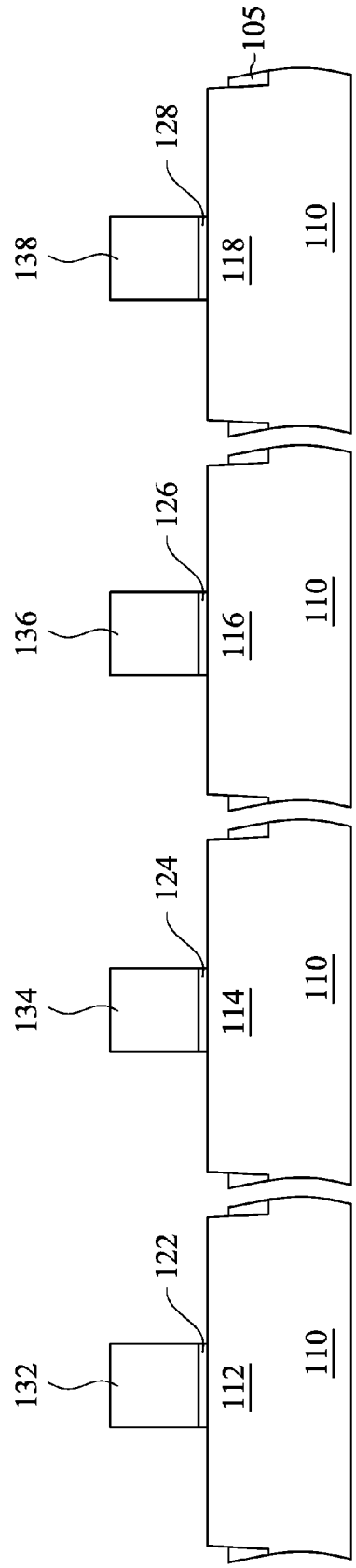
FIG. 1 to FIG. 14 are cross-sectional views of a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Examples of devices that can be improved from one or more embodiments of the present application are semiconductor devices. Such a device, for example, may be a Fin field effect transistor (FinFET) device. The following disclosure will continue with a FinFET example to illustrate various embodiments of the present application. It is understood, however, that the application should not be limited to a particular type of device.

FIG. 1 to FIG. 14 are cross-sectional views of a method for manufacturing a semiconductor device at various stages in accordance with some embodiments of the present disclosure. Reference is made to FIG. 1. Semiconductor fins 112, 114, 116 and 118 are formed on the substrate 110. In some embodiments, the substrate 110 includes silicon. Alternatively, the substrate 110 may include germanium, silicon germanium, gallium arsenide or other appropriate semiconductor materials. Also alternatively, the substrate 110 may include an epitaxial layer. For example, the substrate 110 may have an epitaxial layer overlying a bulk semiconductor. Further, the substrate 110 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the substrate 110 may include a semiconductor-on-insulator (SOI) structure. Also alternatively, the substrate 110 may include a buried dielectric layer, such as a buried oxide (BOX) layer, such as that formed by separation by implantation of oxygen (SIMOX) technology, wafer bonding, SEG, or other appropriate method.

In some embodiments, the semiconductor fins 112, 114, 116 and 118 include silicon. The semiconductor fins 112, 114, 116 and 118 may be formed, for example, by patterning and etching the substrate 110 using photolithography techniques. In some embodiments, a layer of photoresist material (not shown) is sequentially deposited over the substrate 110. The layer of photoresist material is irradiated (exposed) in accordance with a desired pattern (the semiconductor fins 112, 114, 116 and 118 in this case) and developed to remove portions of the photoresist material. The remaining photoresist material protects the underlying material from subsequent processing steps, such as etching. It is noted that other masks, such as an oxide or silicon nitride mask, may also be used in the etching process. The quantity of the semiconductor fins is exemplary, and is not limiting the disclosure.

An isolation dielectric 105 is formed to fill trenches among the semiconductor fins 112, 114, 116 and 118 as shallow trench isolation (STI). The isolation dielectric 105 may include any suitable dielectric material, such as silicon oxide. The method of forming the isolation dielectric 105 may include depositing an isolation dielectric 105 on the substrate 110 to cover the semiconductor fins 112, 114, 116 and 118, optionally performing a planarization process to remove the excess isolation dielectric 105 outside the trenches, and then performing an etching process on the isolation dielectric 105 until upper portions of the semiconductor fins 112, 114, 116 and 118 are exposed.

Gate dielectrics 122, 124, 126 and 128 are formed on the semiconductor fins 112, 114, 116 and 118, and the substrate 110, respectively. The gate dielectrics 122, 124, 126 and 128 may be formed by thermal oxidation, chemical vapor deposition, sputtering, or other suitable methods for forming a gate dielectric. The gate dielectrics 122, 124, 126 and 128 can be patterned to respectively wrap central portions of the semiconductor fins 112, 114, 116 and 118 and respectively expose portions of the semiconductor fins 112, 114, 116 and 118. At least one of the gate dielectrics 122, 124, 126 and 128 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, at least one of the gate dielectrics 122, 124, 126 and 128 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. At least one of the gate dielectrics 122, 124, 126 and 128 may have a multilayer structure such as one layer of silicon oxide (e.g., interfacial layer) and another layer of high-k material. At least one of the gate dielectrics 122, 124, 126 and 128 may be formed using chemical vapor deposition (CVD), physical vapor deposition (PVD), atomic layer deposition (ALD), thermal oxide, ozone oxidation, other suitable processes, or combinations thereof.

Dummy gate structures 132, 134, 136 and 138 are respectively formed on the gate dielectrics 122, 124, 126 and 128. At least one of the dummy gate structures 132, 134, 136 and 138 may be formed by CVD, sputter deposition, or by other suitable technique for depositing conductive materials. The dummy gate structures 132, 134, 136 and 138 can be patterned to respectively wrap central portions of the semiconductor fins 112, 114, 116 and 118 and respectively expose portions of the semiconductor fins 112, 114, 116 and 118. In some embodiments, the gate dielectrics 122, 124, 126 and 128 and the dummy gate structures 132, 134, 136 and 138 may be patterned by the same process. At least one of the dummy gate structures 132, 134, 136 and 138 may include polycrystalline-silicon (poly-Si) or poly-crystalline silicon-germanium (poly-SiGe).

Figure 2:
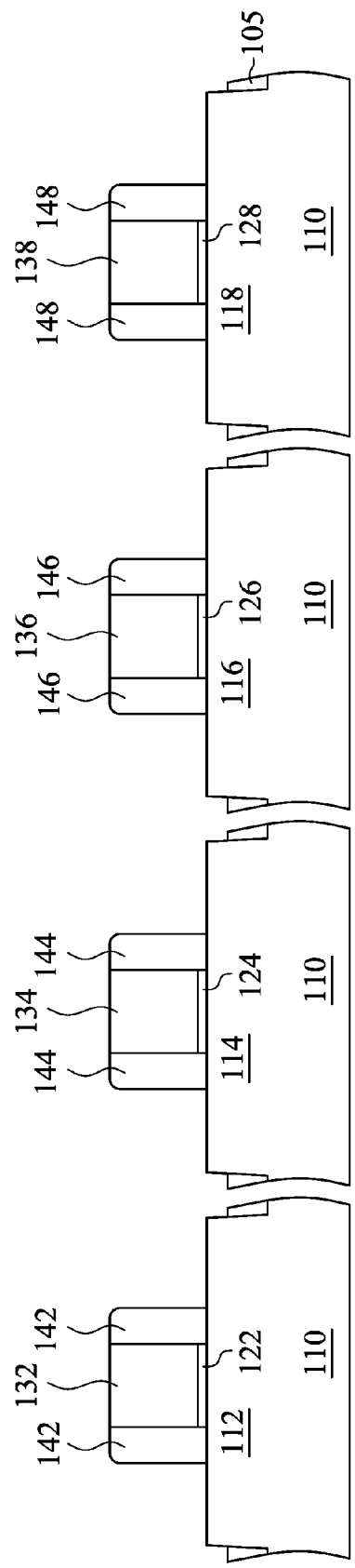

Reference is made to FIG. 2. Gate spacers 142 are formed on the substrate 110 and respectively along opposite sides of the dummy gate structure 132, gate spacers 144 are formed on the substrate 110 and respectively along opposite sides of the dummy gate structure 134, gate spacers 146 are formed on the substrate 110 and along opposite sides of the dummy gate structure 136, and gate spacers 148 are formed on the substrate 110 and along opposite sides of the dummy gate structure 138. In some embodiments, the gate spacers 142, 144, 146 and 148 may include silicon oxide, silicon nitride, silicon oxy-nitride, or other suitable material. The gate spacers 142, 144, 146 and 148 may include a single layer or multilayer structure. To form the gate spacers 142, 144, 146 and 148, a blanket layer may be formed on the substrate 110 by CVD, PVD, ALD, or other suitable technique. Then, an anisotropic etching is performed on the blanket layer to form the gate spacers 142, 144, 146 and 148 respectively on opposite sides of the dummy gate structures 132, 134, 136 and 138. In some embodiments, the gate spacers 142, 144, 146 and 148 can be used to offset subsequently formed doped regions, such as source/drain regions. The gate spacers 142, 144, 146 and 148 can further be used for designing or modifying the source/drain region (junction) profile.

Figure 3:
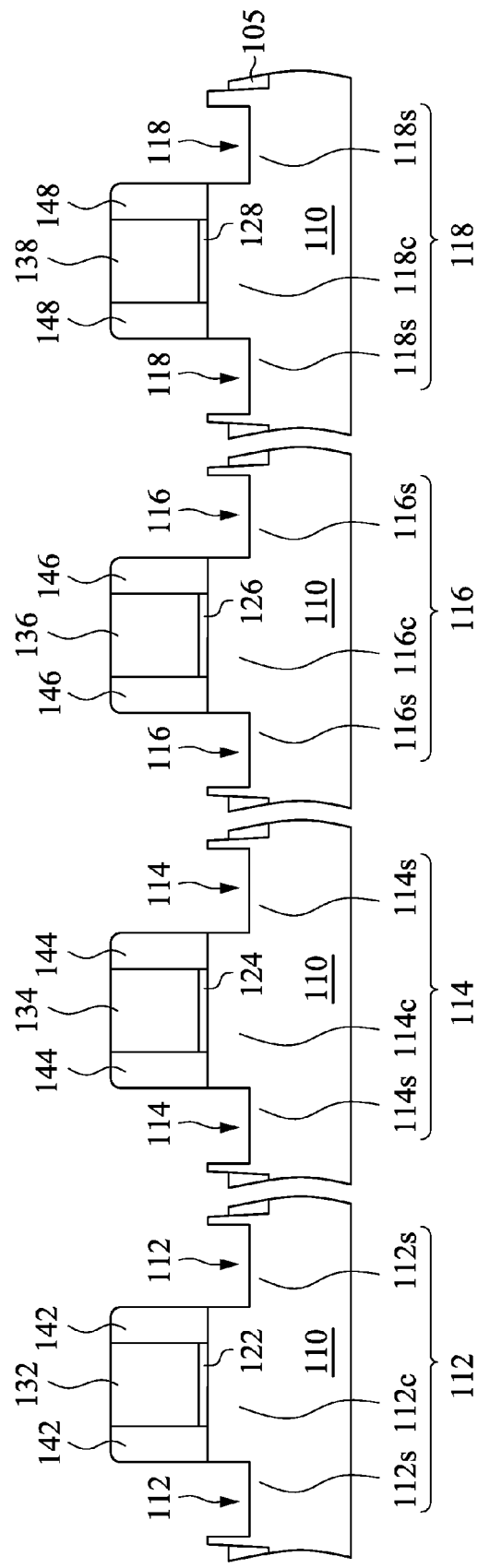

Reference is made to FIG. 3. Portions of the semiconductor fins 112, 114, 116 and 118 exposed by the dummy gate structures 132, 134, 136 and 138 and the gate spacers 142, 144, 146 and 148 are removed (or recessed) to form recesses 112r, 114r, 116r and 118r in the substrate 110. Any suitable amount of material may be removed. The remaining semiconductor fin 112 has a plurality of source/drain portions 112s, and a portion of the semiconductor fin 112 between the source/drain portions 112s can serve as a semiconductor channel 112c. Similarly, there are a plurality of source/drain portions 114s and a semiconductor channel 114c present in the remaining semiconductor fin 114, there are a plurality of source/drain portions 116s and a semiconductor channel 116c present in the remaining semiconductor fin 116, and there are a plurality of source/drain portions 118s and a semiconductor channel 118c present in the remaining semiconductor fin 118. The source/drain portions 112s, 114s, 116s and 118s are embedded in the substrate 110 and portions thereof are exposed by the recesses 112r, 114r, 116r and 118r, respectively. The semiconductor channels 112c, 114c, 116c and 118c respectively underlie the dummy gate structures 132, 134, 136 and 138.

Removing portions of the semiconductor fins 112, 114, 116 and 118 may include forming a photoresist layer or a capping layer (such as an oxide capping layer) over the structure of FIG. 2, patterning the photoresist or capping layer to have openings that expose portions of the semiconductor fins 112, 114, 116 and 118, and etching the exposed portions of the semiconductor fins 112, 114, 116 and 118. In some embodiments, the semiconductor fins 112, 114, 116 and 118 can be etched using a dry etching process. Alternatively, the etching process is a wet etching process, or combination of dry and wet etching process. Removal may include a lithography process to facilitate the etching process. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process is implemented or replaced by other methods, such as maskless photolithography, electron-beam writing, and ion-beam writing. In yet some other embodiments, the lithography process could implement nanoimprint technology. In some embodiments, a pre-cleaning process may be performed to clean the recesses 112r, 114r, 116r and 118r with HF or other suitable solution.

Figure 4:
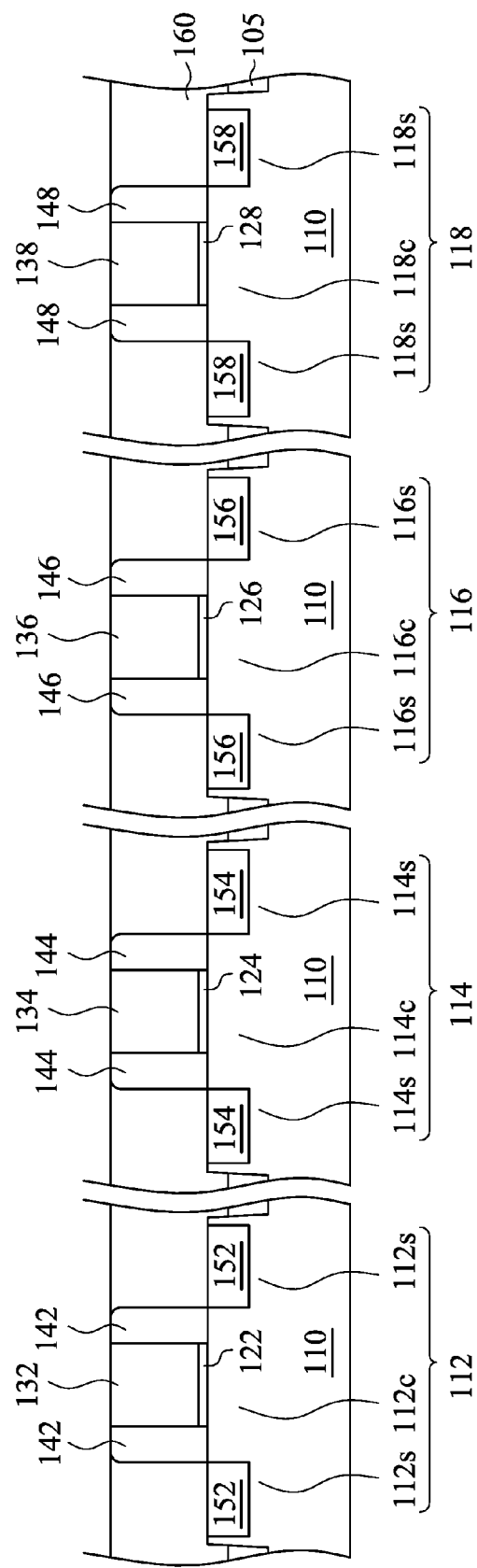

Reference is made to FIG. 4. A plurality of epitaxy structures 152, 154, 156 and 158 are respectively formed in the recesses 112r, 114r, 116r and 118r (see FIG. 3) and on the source/drain portions 112s, 114s, 116s and 118s. The epitaxy structures 152, 154, 156 and 158 may be formed using one or more epitaxy or epitaxial (epi) processes, such that Si features, SiGe features, and/or other suitable features can be formed in a crystalline state on the source/drain portions 112s, 114s, 116s and 118s of the semiconductor fins 112, 114, 116 and 118. In some embodiments, the lattice constant of the epitaxy structures 152, 154, 156 and 158 are different from the lattice constant of the semiconductor fins 112, 114, 116 and 118, so that the semiconductor channels 112c, 114c, 116c and 118c can be strained or stressed by the epitaxy structures 152, 154, 156 and 158 to improve carrier mobility of the semiconductor device and enhance the device performance. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the source/drain portions 112s, 114s, 116s and 118s of the semiconductor fins 112, 114, 116 and 118 (e.g., silicon). Thus, strained or stressed semiconductor channels 112c, 114c, 116c and 118c can be achieved to increase carrier mobility and enhance device performance. The epitaxy structures 152, 154, 156 and 158 may be in-situ doped. The doping species include P-type dopants, such as boron or $BF_2$; N-type dopants, such as phosphorus or arsenic; and/or other suitable dopants including combinations thereof. If the epitaxy structures 152, 154, 156 and 158 are not in-situ doped, a second implantation process (i.e., a junction implant process) is performed to dope the epitaxy structures 152, 154, 156 and 158. One or more annealing processes may be performed to activate the epitaxy structures 152, 154, 156 and 158. The annealing processes include rapid thermal annealing (RTA) and/or laser annealing processes.

Thereafter, an interlayer dielectric (ILD) layer 160 is formed at outer sides of the gate spacers 142, 144, 146 and 148 and on the substrate 110. The ILD layer 160 includes silicon oxide, silicon nitride, silicon oxynitride, silicon carbide, low-dielectric constant dielectric material or a combination thereof. The ILD layer 160 includes a single layer or multiple layers. The ILD layer 160 is formed by a suitable technique, such as CVD. A chemical mechanical planarization (CMP) process may be applied to remove excessive ILD layer 160 and expose top surfaces of the dummy gate structures 132, 134, 136 and 138 to a subsequent dummy gate removal process.

Figure 5:
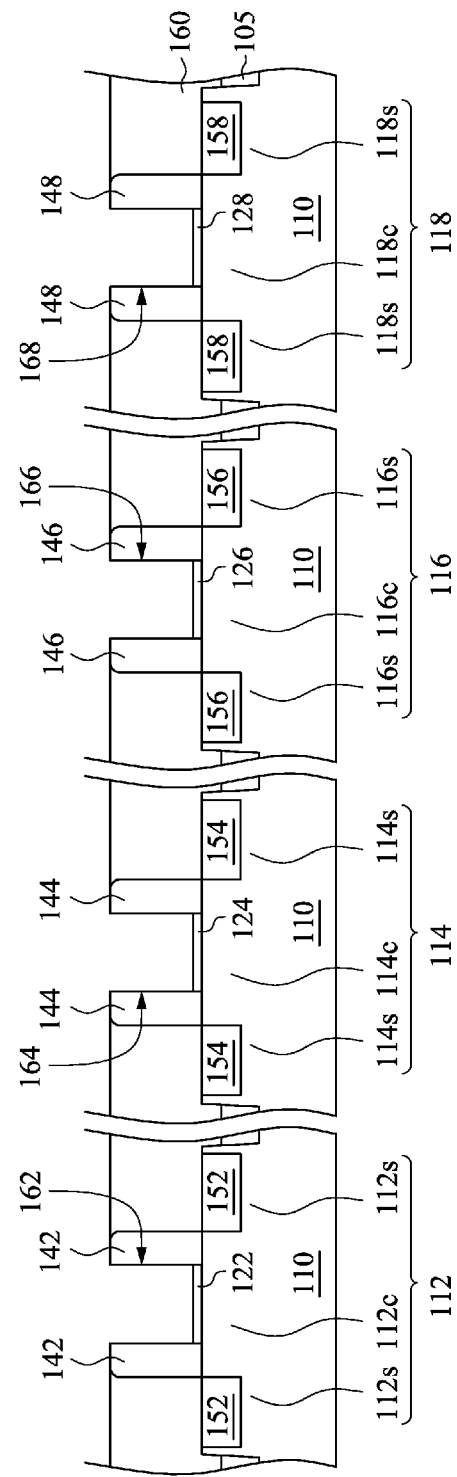

Reference is made to FIG. 5. The dummy gate structures 132, 134, 136 and 138 (see FIG. 4) are removed to form an opening 162 with the gate spacers 142 as its sidewall, an opening 164 with the gate spacers 144 as its sidewall, an opening 166 with the gate spacers 146 as its sidewall and an opening 168 with the gate spacers 148 as its sidewall. In some embodiments, the gate dielectrics 122, 124, 126 and 128 are removed as well. Alternatively, in some embodiments, the dummy gate structures 132, 134, 136 and 138 are removed while the gate dielectrics 122, 124, 126 and 128 retain as shown in FIG. 5. The dummy gate structures 132, 134, 136 and 138 (and the gate dielectrics 122, 124, 126 and 128) may be removed by dry etching, wet etching, or a combination of dry and wet etching. For example, a wet etching process may include exposure to a hydroxide containing solution (e.g., ammonium hydroxide), deionized water, and/or other suitable etchant solutions.

Figure 6:
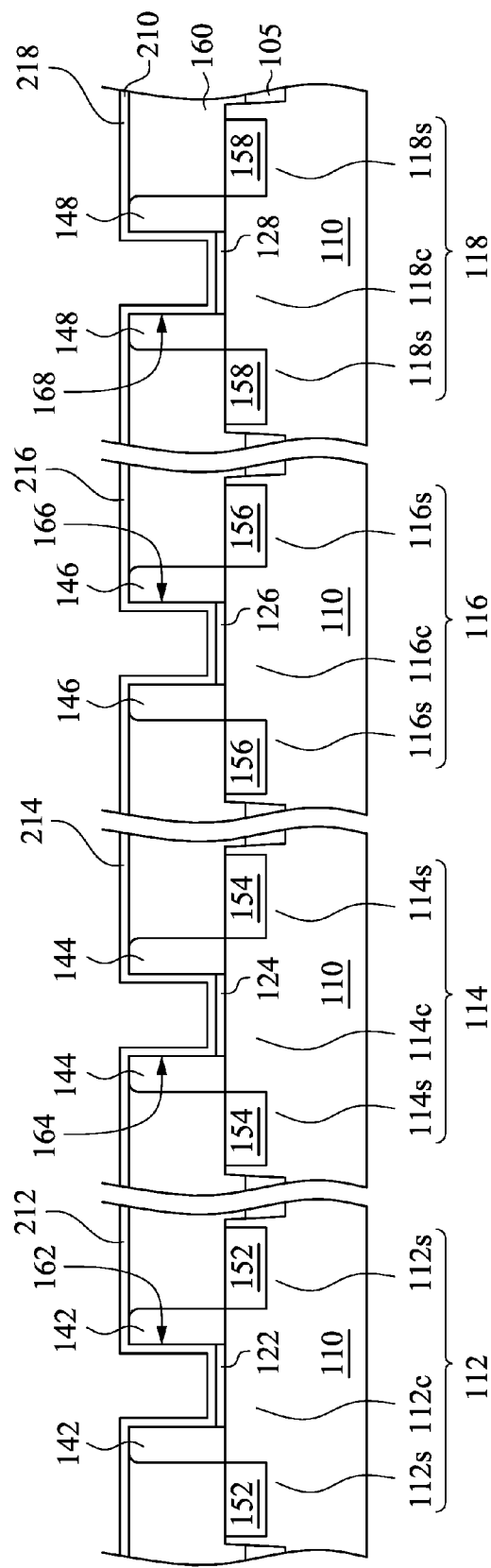

Reference is made to FIG. 6. A tantalum nitride (TaN) structure 210 can be conformally formed on the structure shown in FIG. 5. In other words, the tantalum nitride structure 210 is formed on the semiconductor channels 112c, 114c, 116c and 118c. The tantalum nitride structure 210 can provide a suitable work function value for a gate stack of a semiconductor device, so as to benefit tuning the threshold voltage of the semiconductor device. The tantalum nitride structure 210 can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof. Portions of the tantalum nitride structure 210 respectively present on the semiconductor fins 112, 114, 116 and 118 can be referred to as tantalum nitride layers 212, 214, 216 and 218. In some embodiments, the tantalum nitride layers 212, 214, 216 and 218 are respectively in contact with the gate dielectrics 122, 124, 126 and 128. In some other embodiments, an additional structure, such as a titanium nitride layer, may be formed on the gate dielectrics 122, 124, 126 and 128, and the tantalum nitride structure 210 is formed on the additional layer.

Figure 7:
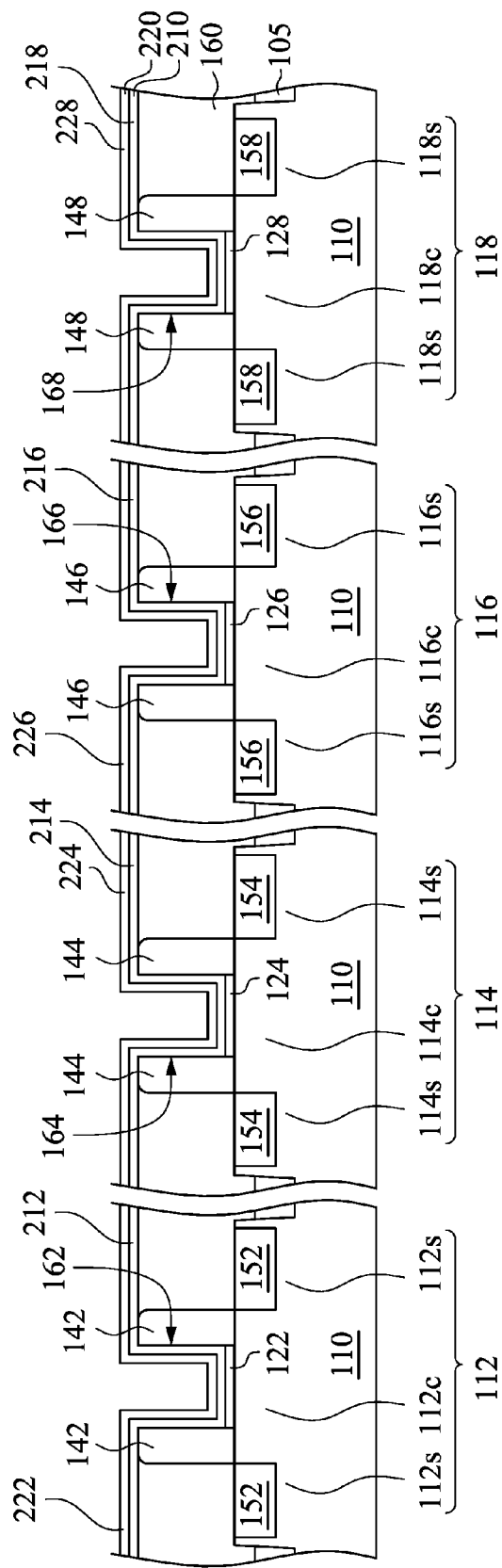

Reference is made to FIG. 7. A first work function material 220 can be formed on the structure shown in FIG. 6. The first work function material 220 can provide another suitable work function value for the gate stack of the semiconductor device. In some embodiments, the first work function material 220 may include a titanium-containing material, such as, for example, titanium nitride (TiN). In some embodiments, tantalum is absent in the first work function material 220. The first work function material 220 can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof. Portions of the first work function material 220 respectively present on the semiconductor fins 112, 114, 116 and 118 can be referred to as first work function layers 222, 224, 226 and 228. When the work function material 220 includes the titanium-containing material, the work function layers 222, 224, 226 and 228 can be referred to as titanium-containing layers. In some embodiments, thickness of at least one of the work function layers 222, 224, 226 and 228 ranges from about 0.5 nm to 2 nm.

Figure 8:
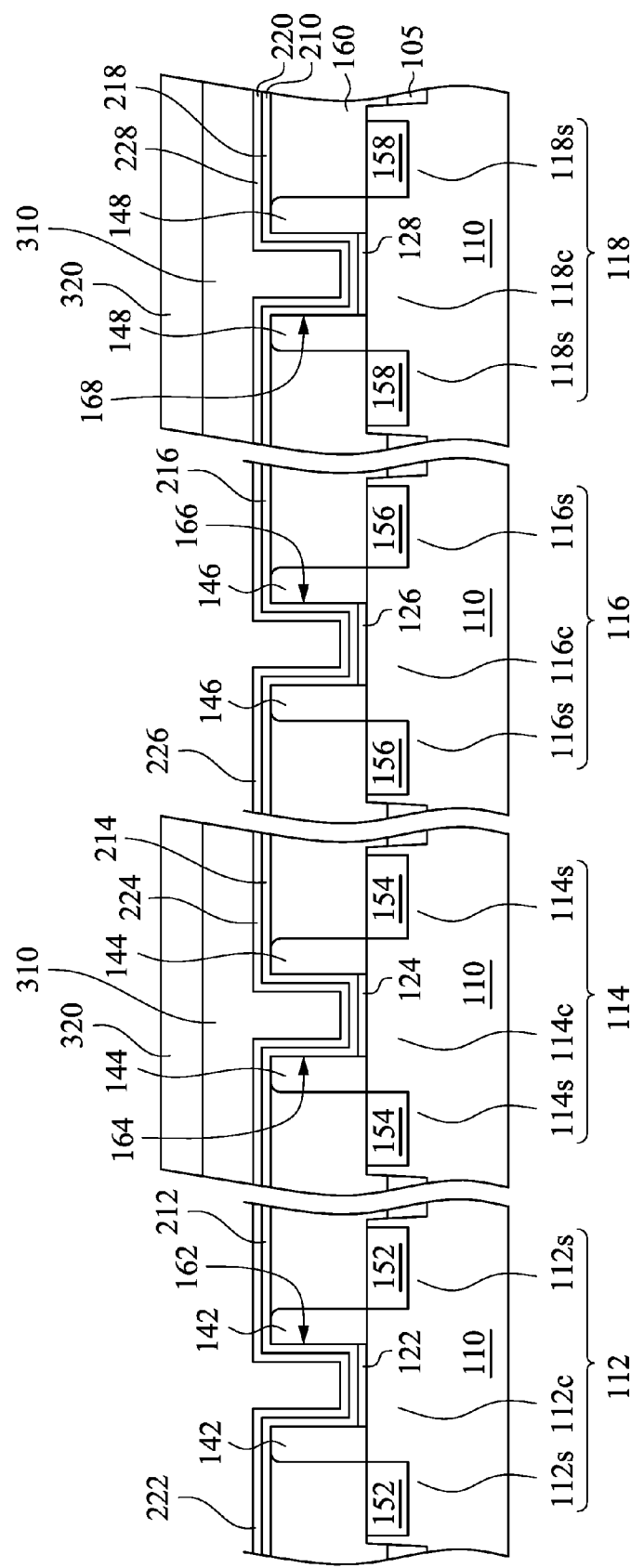

Reference is made to FIG. 8. A dielectric material 310, e.g. spin-on-glass (SOG), can be formed, covering the first work function layers 224 and 228 on the semiconductor fins 114 and 118 and filling the openings 164 and 168. A photoresist 320 can be defined over the dielectric material 310. The dielectric material 310 and the photoresist 320 can be provided for patterning the first work function material 220. The dielectric material 310 and the photoresist 320 can be defined by, for example, a spin-on process, a photolithographic process, and an etching process.

Figure 9:
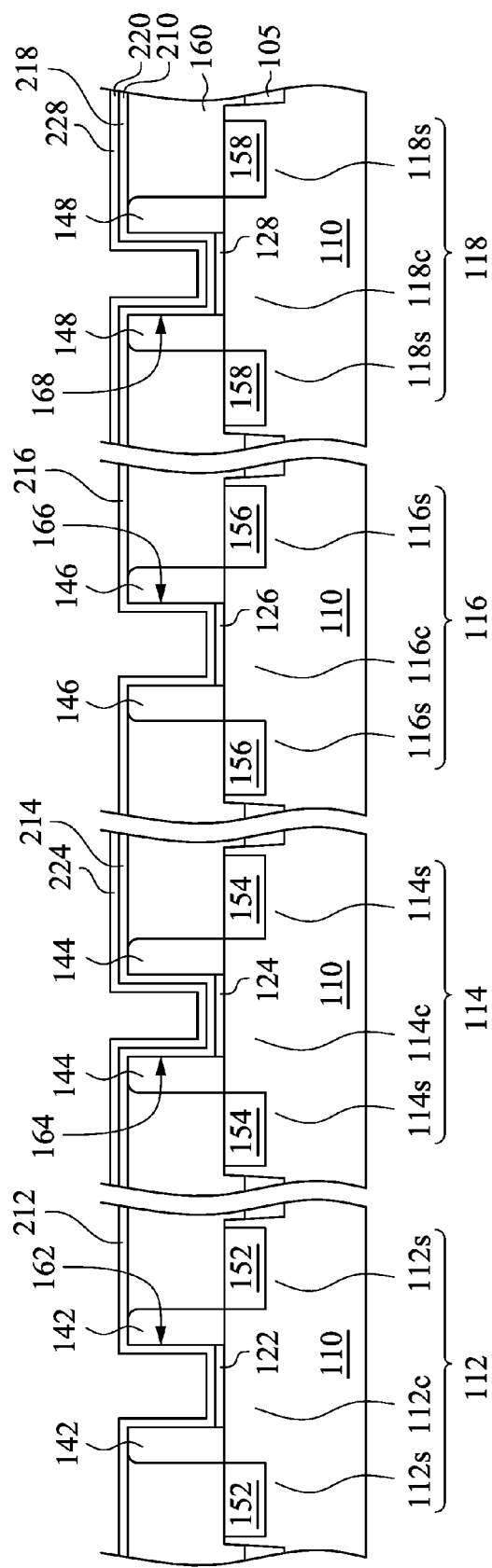

Reference is made to FIG. 9. The first work function layers 222 and 226 on the semiconductor fins 112 and 116 that are not covered by the dielectric material 310 and the photoresist 320 shown in FIG. 8 can be removed, so that the first work function material 220 can be patterned to remain on the semiconductor fins 114 and 118, and not on the semiconductor fins 112 and 116. After patterning the first work function material 220, the dielectric material 310 and the photoresist 320 shown in FIG. 8 can be removed by a wet etching process, a dry etching process, or combinations thereof, exposing the remained first work function material 220. After the patterning, the tantalum nitride layer 212 is present on the semiconductor channel 112c, the tantalum nitride layer 214 and the first work function layer 224 are present on the semiconductor channel 114c, the tantalum nitride layer 216 is present on the semiconductor channel 116c, and the tantalum nitride layer 218 and the first work function layer 228 are present on the semiconductor channel 118c.

Figure 10:
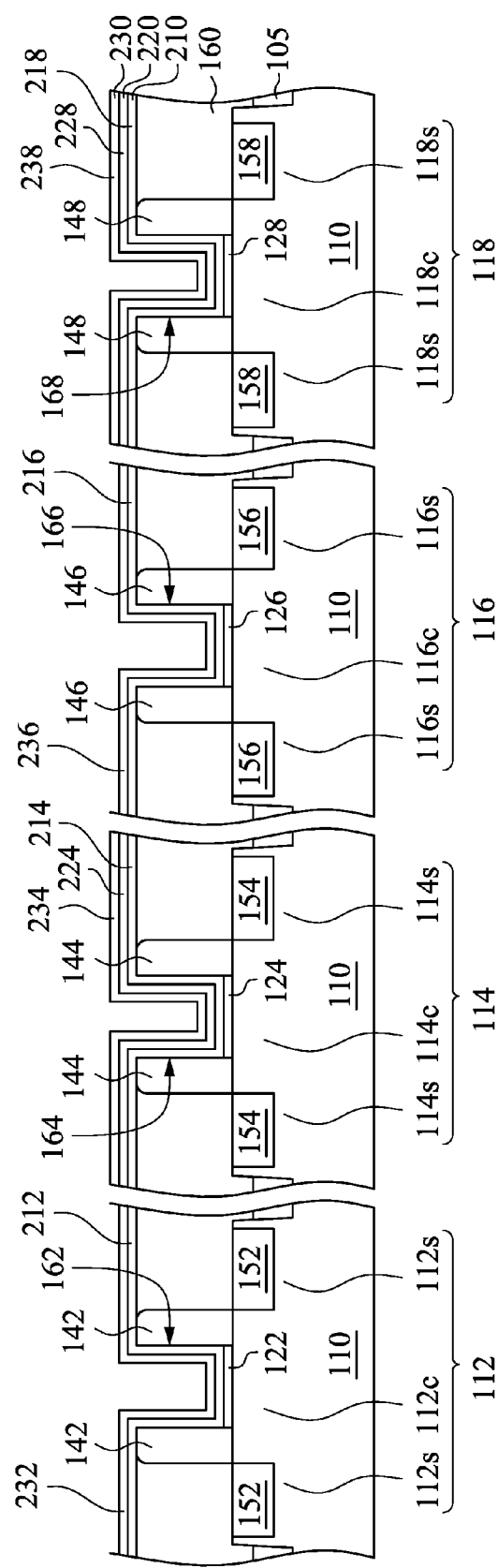

Reference is made to FIG. 10. A second work function material 230 can be formed on the structure shown in FIG. 9. The second work function material 230 can provide another suitable work function value for the gate stack of the semiconductor device. In some embodiments, the second work function material 230 may include a titanium-containing material, such as, for example, titanium nitride (TiN). In other words, the second work function material 230 and the first work function material 220 may include substantially the same material. In some embodiments, tantalum is absent in the second work function material 230. The second work function material 230 can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof. Portions of the second work function material 230 respectively present on the semiconductor fins 112, 114, 116 and 118 can be referred to as second work function layers 232, 234, 236 and 238. When the work function material 230 includes the titanium-containing material, the work function layers 232, 234, 236 and 238 can be referred to as titanium-containing layers. In some embodiments, thickness of at least one of the work function layers 232, 234, 236 and 238 ranges from about 0.5 nm to 2 nm.

Figure 11:
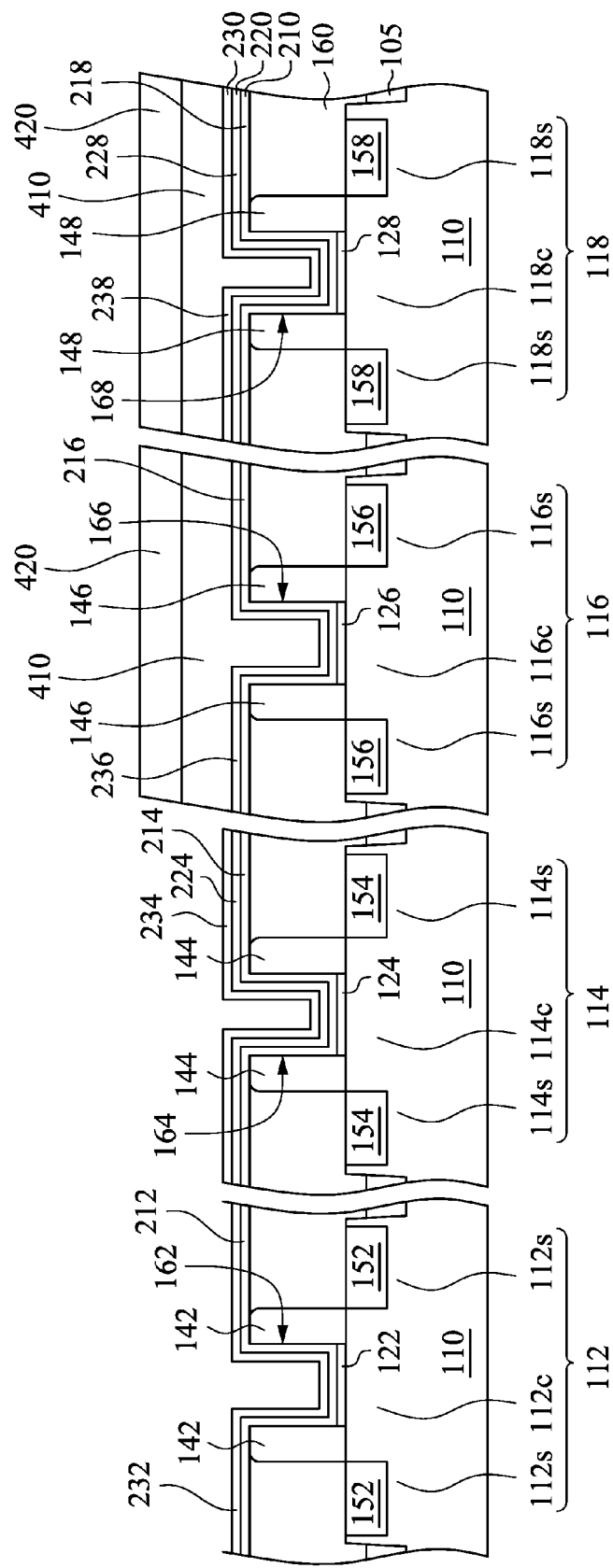

Reference is made to FIG. 11. A dielectric material 410, e.g. spin-on-glass (SOG), can be formed, covering the second work function layers 236 and 238 on the semiconductor fins 116 and 118 and filling the openings 166 and 168. A photoresist 420 can be defined over the dielectric material 410. The dielectric material 410 and/or the photoresist 420 can be provided for patterning the second work function material 230. The dielectric material 410 and the photoresist 420 can be defined by, for example, a spin-on process, a photolithographic process, and an etching process.

Figure 12:
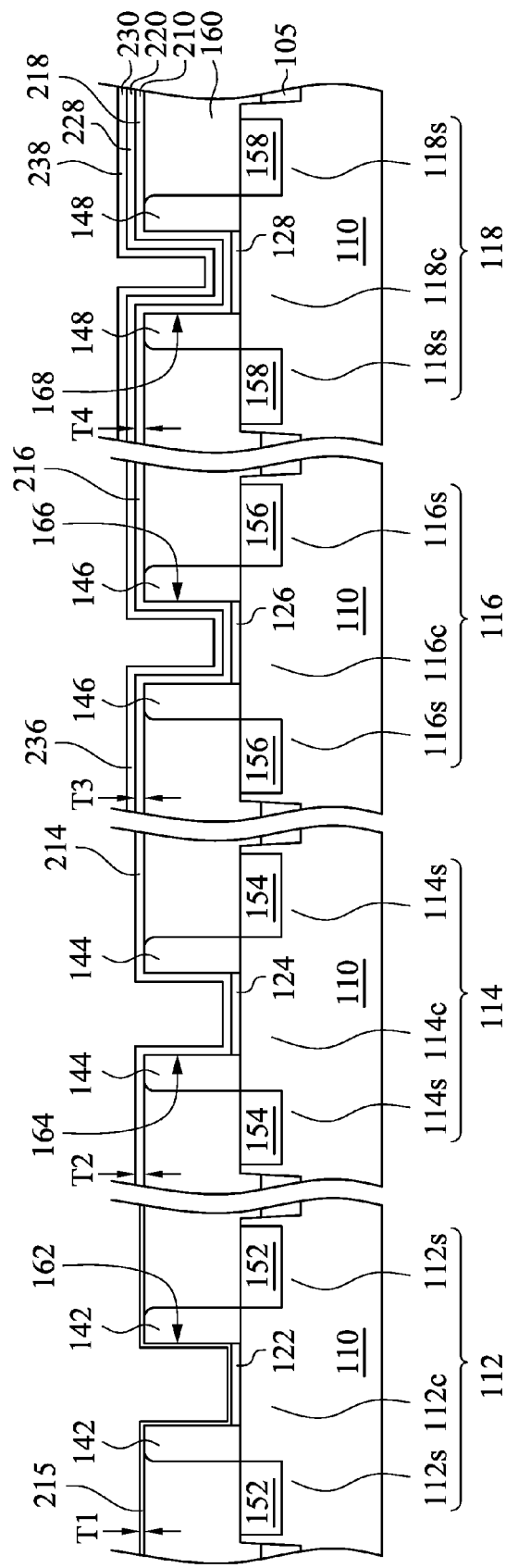

Reference is made to FIG. 12. The second work function layers 232 and 234 on the semiconductor fins 112 and 114 that are not covered by the dielectric material 410 and the photoresist 420 shown in FIG. 11 can be removed, so that the second work function material 230 can be patterned to remain on the semiconductor fins 116 and 118, and not on the semiconductor fins 112 and 114. In some embodiments, the patterning process removes the first work function layer 224 on the semiconductor fin 114 after the overlying second work function layer 234 is removed, and it also removes at least a portion of the tantalum nitride layer 212 on the semiconductor fin 112 because the tantalum nitride layer 212 is exposed after the overlying second work function layer 232 is removed. During the removing at least a portion of the tantalum nitride layer 212 on the semiconductor channel 112c, the tantalum nitride layer 214 on the semiconductor channel 114c is protected by the first work function layer 224, and such a first work function layer 224 may serve as a sacrificial layer to prevent the underlying tantalum nitride layer 214 from being trimmed, thinned or removed. Therefore, in some embodiments, the tantalum nitride layer 212 on the semiconductor fin 112 is thinned as a thinner tantalum nitride layer 215, and the non-thinned tantalum nitride layer 214 on the semiconductor fin 114 may be referred to as a thicker tantalum nitride layer 214 that is thicker than the thinner tantalum nitride layer 215. In some embodiments, since the tantalum nitride layers 216 and 218 on the semiconductor fins 116 and 118 are protected by the overlying work function layers, the dielectric material 410 and the photoresist 420, these tantalum nitride layers 216 and 218 may be referred to as thicker tantalum nitride layers 216 and 218 that are thicker than the thinner tantalum nitride layer 215. In other words, the thinner tantalum nitride layer 215 on the semiconductor channel 112c has a thickness T1, the thicker tantalum nitride layers 214, 216 and 218 on the semiconductor channels 114c, 116c and 118c have thicknesses T2, T3 and T4, and the thickness T1 is different from the thicknesses T2, T3 and T4. More particularly, the thickness T1 is less than the thicknesses T2, T3 and T4. In some embodiments, the thicknesses T2, T3 and T4 may be substantially the same because the tantalum nitride layers 214, 216 and 218 on the semiconductor channels 114c, 116c and 118c are not thinned, trimmed or removed. In some embodiments, the difference between the thickness T1 and the thickness T2, T3 or T4 may range from about 5 Å to about 15 Å, so as to benefit to generate predetermined threshold voltage difference between different FinFETs. In some embodiments, the thickness T1 ranges from about 1 Å to about 5 Å, so as to benefit to generate predetermined threshold voltage for the FinFET formed by the semiconductor fin 112. In some embodiments, the thickness T2, T3, T4 or combinations thereof may range from about 5 Å to about 20 Å.

As the thickness of the tantalum nitride layer decreases, the threshold voltage of the semiconductor device shifts, and therefore, a semiconductor device, such as a FinFET, including the thinner tantalum nitride layer 215 can have a threshold voltage different from that includes the thicker tantalum nitride layer 214. As such, the patterning process performed in FIG. 12 enables the FinFETs formed by the first and the second semiconductor fins 112 and 114 to have different threshold voltages due to a thickness difference between the thinner tantalum nitride layer 215 and the thicker tantalum nitride layer 214. In some other embodiments, the tantalum nitride layer 212 on the semiconductor fin 112 can be removed without leaving the thinner tantalum nitride layer 215 on the semiconductor fin 112. In other words, tantalum nitride can be absent on the semiconductor channel 112c. Since tantalum nitride is still present on the semiconductor channel 114c, the tantalum nitride amount difference can enable the FinFETs formed by the first and the second semiconductor fins 112 and 114 to have different threshold voltages as well.

After patterning the second work function material 230, the dielectric material 410 and the photoresist 420 shown in FIG. 11 can be removed by a wet etching process, a dry etching process, or combinations thereof, exposing the remained second work function layer 230. After this patterning process, the thinner tantalum nitride layer 215 is present on the semiconductor channel 112c, the thicker tantalum nitride layer 214 is present on the semiconductor channel 114c, the thicker tantalum nitride layer 216 and the second work function layer 236 are present on the semiconductor channel 116c, and the thicker tantalum nitride layer 218, the first work function layer 228 and the second work function layer 238 are present on the semiconductor channel 118c.

Figure 13:
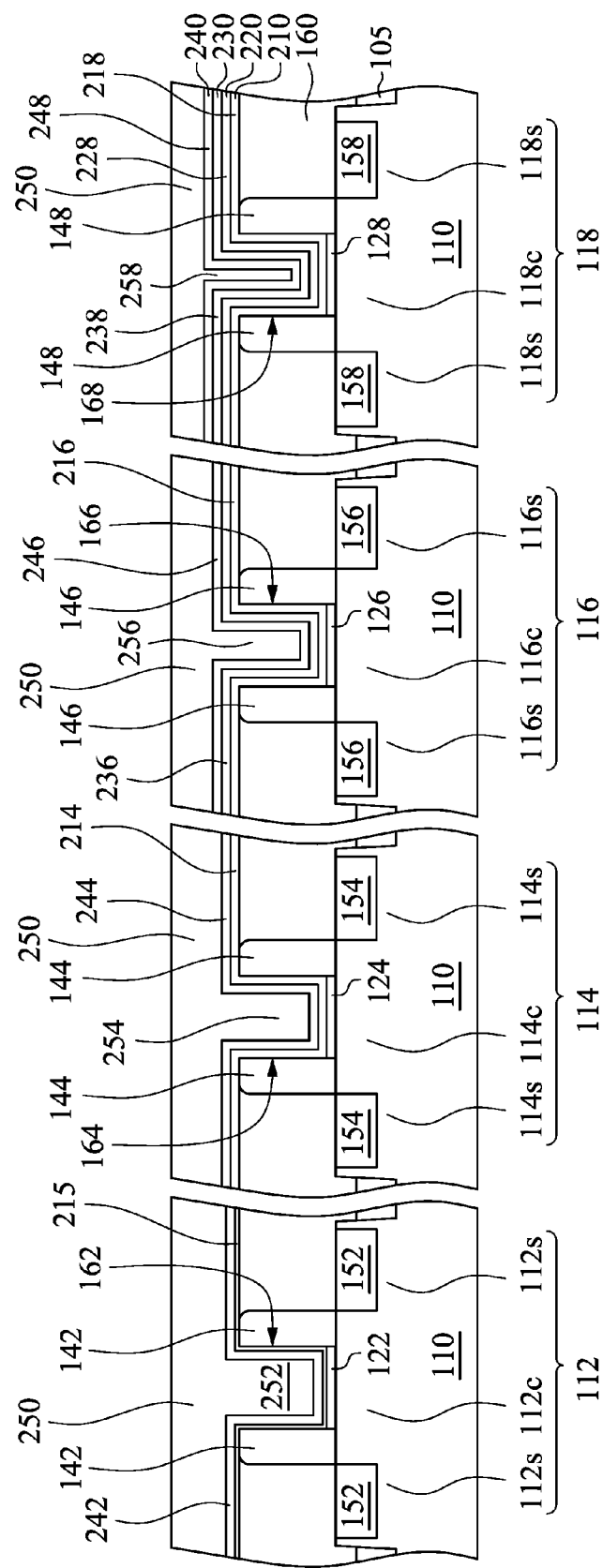

Reference is made to FIG. 13. A third work function material 240 can be formed on the structure shown in FIG. 12. The third work function material 240 can provide another suitable work function value for the gate stack of the semiconductor device. In some embodiments, the third work function material 240 may include a titanium-containing material, such as, for example, titanium aluminum carbide (TiAlC). In other words, the third work function material 240 may be different from at least one of the first work function material 220 and the second work function material 230. In some embodiments, tantalum is absent in the third work function material 240. The third work function material 240 can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof. Portions of the third work function material 240 respectively present on the semiconductor fins 112, 114, 116 and 118 can be referred to as third work function layers 242, 244, 246 and 248. When the work function material 240 includes the titanium-containing material, the work function layers 242, 244, 246 and 248 can be referred to as titanium-containing layers. In some embodiments, thickness of at least one of the work function layers 242, 244, 246 and 248 ranges from about 3 nm to about 6 nm.

Thereafter, remaining openings 162, 164, 166 and 168 are then filled or overfilled with a filling conductor 250. In some embodiments, the filling conductor 250 includes, for example, tungsten (W). The filling conductor 250 can be formed using ALD, PVD, CVD, or other suitable process. In some other embodiments, the filling conductor 250 includes aluminum (Al), copper (Cu) or other suitable conductive material. Portions of the filling conductor 250 respectively present in the openings 162, 164, 166 and 168 can be referred to as filling conductor layers 252, 254, 256 and 258. In some embodiments, thickness of at least one of the filling conductor layers 252, 254, 256 and 258 ranges from about 100 nm to about 200 nm. In some embodiments, an additional material may be formed on the third work function material 240, and the filling conductor 250 may be formed on the additional material. Such an additional material may be, for example, TiN, which may increase the adhering strength of tungsten and TiAlC.

Figure 14:
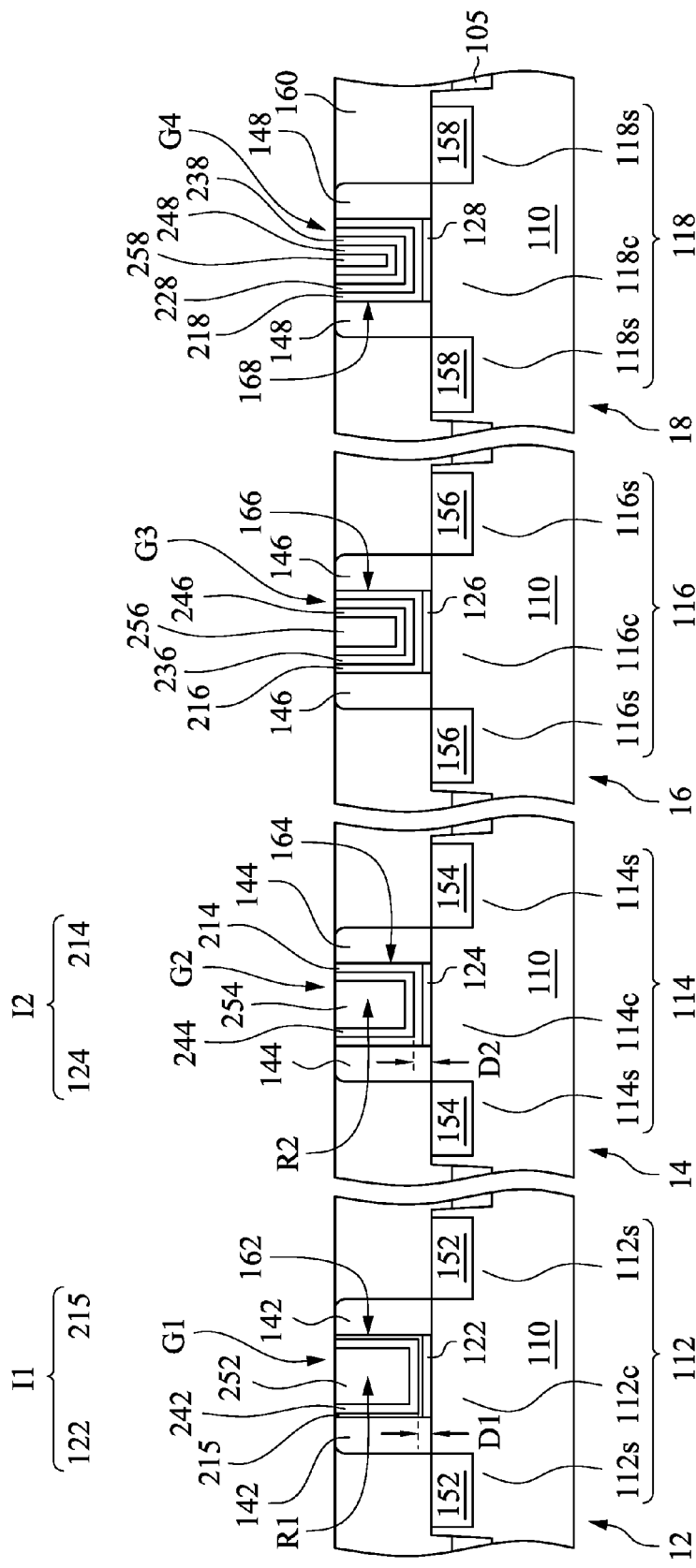

Reference is made to FIG. 14. A chemical mechanical planarization (CMP) process is applied to remove excessive the tantalum nitride structure 210, the first work function material 220, the second work function material 230, the third work function material 240 and the filling conductor 250 outside the openings 162, 164, 166 and 168 to provide a substantially planar top surface. The remaining thinner tantalum nitride layer 215, the remaining third work function layer 242 and the remaining filling conductor layer 252 form a gate stack G1 in the opening 162. The remaining thicker tantalum nitride layer 214, the remaining third work function layer 244 and the remaining filling conductor layer 254 form a gate stack G2 in the opening 164. The remaining thicker tantalum nitride layer 216, the remaining second work function layer 236, the remaining third work function layer 246 and the remaining filling conductor layer 256 form a gate stack G3 in the opening 166. The remaining thicker tantalum nitride layer 218, the remaining first work function layer 228, the remaining second work function layer 238, the remaining third work function layer 248 and the remaining filling conductor layer 258 form a gate stack G4 in the opening 168. The gate stacks G1, G2, G3 and G4 may be referred to as metal gate electrodes in some cases. It is understood that the formation of the gate stacks G1, G2, G3 and G4 mentioned above is illustrative, and is not limiting the present disclosure.

In FIG. 14, the semiconductor fin 112, the epitaxy structures 152 and the gate stack G1 form a FinFET 12, the semiconductor fin 114, the epitaxy structures 154 and the gate stack G2 form a FinFET 14, the semiconductor fin 116, the epitaxy structures 156 and the gate stack G3 form a FinFET 16, and the semiconductor fin 118, the epitaxy structures 158 and the gate stack G4 form a FinFET 18. In some embodiments, at least one of the FinFETs 12, 14, 16 and 18 may be an N-type FinFET when the at least one of the FinFETs 12, 14, 16 and 18 includes N-type doped source/drain epitaxy structures. In some embodiments, at least one of the FinFETs 12, 14, 16 and 18 may be a P-type FinFET when the at least one of the FinFETs 12, 14, 16 and 18 includes P-type doped source/drain epitaxy structures.

In the gate stack G1, the thinner tantalum nitride layer 215 and the gate dielectric 122 can be referred to as an interposing layer I1 present between the semiconductor channel 112c and the third work function layer 242. In the gate stack G2, the thicker tantalum nitride layer 214 and the gate dielectric 124 can be referred to as an interposing layer I2 present between the semiconductor channel 114c and the third work function layer 244. Since the thinner tantalum nitride layer 215 is thinner than the thicker tantalum nitride layer 214, the interposing layers I1 and I2 are different at least in tantalum nitride amount. More particularly, the interposing layers I1 and I2 have different tantalum nitride amount per unit area. Such a tantalum nitride amount difference may benefit the gate stacks G1 and G2 to have different effective work function. More particularly, since the thinner tantalum nitride layer 215 and the thicker tantalum nitride layer 214 have different thicknesses T1 and T2, the effective work function of the gate stack G1 can be different from that of the gate stack G2 even if the third work function layers 242 and 244 of the gate stacks G1 and G2 may be substantially the same in composition and thickness. Therefore, the FinFET 12 can have a threshold voltage different from that of the FinFET 14. In other words, thicknesses of the tantalum nitride layers in different gate stacks of FinFETs can be adjusted to make threshold voltages of the FinFETs different. Stated differently, the gate stacks may be formed to be different at least in tantalum nitride amount, so as to generate different threshold voltages for the FinFETs. In some other embodiments, tantalum nitride is absent in the gate stack G1 and is present in gate stack G2, and such a tantalum nitride amount difference between the gate stacks G1 and G2 can generate different threshold voltages for the FinFETs 12 and 14 as well.

In some embodiments, the third work function layer 242 and the semiconductor channel 112c define a first distance D1, and the third work function layer 244 and the semiconductor channel 114c define a second distance D2. The first distance D1 correlates with the thickness T1 of the thinner tantalum nitride layer 215 because the thinner tantalum nitride layer 215 is present between the third work function layer 242 and the semiconductor channel 112c. Similarly, the second distance D2 correlates with the thickness T2 of the thicker tantalum nitride layer 214 because the thicker tantalum nitride layer 214 is present between the third work function layer 244 and the semiconductor channel 114c. As such, the first distance D1 is different from the second distance D2 because the thinner tantalum nitride layer 215 and the thicker tantalum nitride layer 214 have different thicknesses T1 and T2. More particularly, the first distance D1 is shorter than the second distance D2 because the thickness T1 of the thinner tantalum nitride layer 215 is less than the thickness T2 of the thicker tantalum nitride layer 214. In some embodiments, when the gate dielectrics 122 and 124 have substantially the same thickness, a difference between the first and second distances D1 and D2 is substantially the same as a difference between the thicknesses T1 and T2 of the thinner tantalum nitride layer 215 and the thicker tantalum nitride layer 214.

In some embodiments, since the effective work functions of the gate stacks G1 and G2 can be different due to the thickness difference between the thinner tantalum nitride layer 215 and the thicker tantalum nitride layer 214, the third work function layers 242 and 244 of the gate stacks G1 and G2 can be substantially the same in composition and thickness. For example, the third work function layers 242 and 244 of the gate stacks G1 and G2 may have substantially the same thickness. In other words, the work function layers 242 and 244 having substantially the same thickness are respectively present on the tantalum nitride layers 215 and 214 having different thicknesses. Stated differently, the thickness difference between the thinner tantalum nitride layer 215 and the thicker tantalum nitride layer 214 is greater than the thickness difference between the third work function layers 242 and 244. In some embodiments, when the third work function layers 242 and 244 of the gate stacks G1 and G2 are titanium-containing layers, the third work function layers 242 and 244 may have substantially the same titanium amount because the tantalum nitride amount difference between the gate stacks G1 and G2 enables the effective work functions of the gate stacks G1 and G2 to be different.

The filling conductor layer 252 is present in a recess R1 of the third work function layer 242 of the gate stack G1. The filling conductor layer 254 is present in a recess R2 of the third work function layer 244 of the gate stack G2. Since the thinner tantalum nitride layer 215 is present among the filling conductor layer 252 and the gate spacers 142, and the thicker tantalum nitride layer 214 is present among the filling conductor layer 254 and the gate spacers 144, widths of the filling conductor layers 252 and 254 correlates with the thicknesses T1 and T2 of the tantalum nitride layers 214 and 215. Since the thicknesses T1 and T2 of the tantalum nitride layers 214 and 215 are different, the filling conductor layers 252 and 254 can have different widths. More particularly, since the thinner tantalum nitride layer 215 is thinner than the thicker tantalum nitride layer 214, the filling conductor layer 252 may be wider than the filling conductor layer 254.

In the gate stack G3, the second work function layer 236 and the third work function layer 246 may be referred to as a work function layer present on the thicker tantalum nitride layer 216, and such a work function layer and the work function layer 242 present on the thinner tantalum nitride layer 215 may be different in at least one of composition and thickness. For example, when the second work function layer 236 includes TiN and the third work function layer 246 includes TiAlC, and the third work function layer 242 includes TiAlC, the work function layer 242 present on the thinner tantalum nitride layer 215 and the work function layer (including layers 236 and 246) present on the thicker tantalum nitride layer 216 may have different compositions and thicknesses. Therefore, the difference between the threshold voltages of the FinFETs 12 and 16 can be increased.

In the gate stack G4, the first work function layer 228, the second work function layer 238 and the third work function layer 248 may be referred to as a work function layer present on the thicker tantalum nitride layer 218. Since the work function layer (the layer 244) in the gate stack G2, the work function layer (including layers 236 and 246) in the gate stack G3 and the work function layer (including layers 228, 238 and 248) are different in composition, thickness or combinations thereof, gate stacks G2, G3 and G4 can have different effective work functions. Since the tantalum nitride layers 215 and 214 have different thicknesses, gate stacks G1 and G2 can have different effective work functions. In other words, the difference among the effective work functions of the gate stacks G2, G3 and G4 is determined by the work function layers on the tantalum nitride layers, while the difference between the effective work functions of the gate stacks G1 and G2 is determined by the thickness difference between the tantalum nitride layers and not determined by the work function layers on the tantalum nitride layers. Therefore, plural effective work functions of the gate stacks can be achieved using reduced work function metal deposition and patterning processes.

In some embodiments, gate stacks are different at least in tantalum nitride amount, and therefore, the gate stacks can have different effective work functions, so that different threshold voltages can be achieved. In some embodiments, since metal gate electrodes respectively include tantalum nitride layers having different thicknesses, the tantalum nitride layers can make the metal gate electrodes have different effective work functions, and therefore, different threshold voltages can be achieved.

According to some embodiments, a semiconductor device includes a first semiconductor channel, a second semiconductor channel, a first gate stack and a second gate stack. The first gate stack is present on the first semiconductor channel. The first gate stack includes a first work function layer and a first interposing layer present between the first semiconductor channel and the first work function layer. The second gate stack is present on the second semiconductor channel. The second gate stack includes a second work function layer and a second interposing layer present between the second semiconductor channel and the second work function layer. The first interposing layer and the second interposing layer are different at least in tantalum nitride amount.

According to some embodiments, a semiconductor device includes a first semiconductor channel, a second semiconductor channel, a first metal gate electrode and a second metal gate electrode. The first metal gate electrode is present on the first semiconductor channel. The first metal gate electrode includes a first titanium-containing layer and a thinner tantalum nitride layer present between the first semiconductor channel and the first titanium-containing layer. The second metal gate electrode is present on the second semiconductor channel. The second metal gate electrode includes a second titanium-containing layer and a thicker tantalum nitride layer present between the second semiconductor channel and the second titanium-containing layer. The thicker tantalum nitride layer is thicker than the thinner tantalum nitride layer.

According to some embodiments, a method of manufacturing a semiconductor device includes forming a tantalum nitride structure on a first semiconductor channel and a second semiconductor channel, removing at least a portion of the tantalum nitride structure on the first semiconductor channel, forming a work function material on the first semiconductor channel and the second semiconductor channel, and forming a filling conductor on the work function material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a tantalum nitride structure on a first semiconductor channel and a second semiconductor channel;
    removing at least a portion of the tantalum nitride structure on the first semiconductor channel;
    forming a first work function material on the first semiconductor channel and the second semiconductor channel; and
    forming a filling conductor on the first work function material.

2. The method of claim 1, wherein during the removing the portion of the tantalum nitride structure on the first semiconductor channel, another portion of the tantalum nitride structure on the second semiconductor channel is protected.

3. The method of claim 1, further comprising:
forming a second work function material on the second semiconductor channel after the forming the tantalum nitride structure, wherein during the removing, the second work function material is removed.

4. The method of claim 1, wherein the removing comprises thinning the portion of the tantalum nitride structure on the first semiconductor channel.

5. The method of claim 4, wherein during the thinning, another portion of the tantalum nitride structure on the second semiconductor channel is not thinned.

6. The method of claim 1, further comprising:
forming a second work function material on the tantalum nitride structure over the first semiconductor channel and over the second semiconductor channel prior to the removing; and
removing a first portion of the second work function material over the first semiconductor channel while leaving a second portion of the second work function material over the second semiconductor channel.

7. The method of claim 6, wherein the removing the portion of the tantalum nitride structure further removes the second portion of the second work function material over the second semiconductor channel.

8. The method of claim 6, further comprising:
forming a third work function material over the first semiconductor channel and the second semiconductor channel after the removing the first portion of the second work function material.

9. The method of claim 8, wherein the removing the portion of the tantalum nitride structure further removes the third work function material over the first semiconductor channel and over the second semiconductor channel.

10. A method of forming a semiconductor device, comprising:
forming a first metal multilayer stack over a first semiconductor channel and a second metal multilayer stack over a second semiconductor channel, wherein the first metal multilayer stack has less layers than the second metal multilayer stack, and a bottom layer of the first metal multilayer stack and a bottom layer of the second metal multilayer stack are made of tantalum nitride;
removing a portion of the first metal multilayer stack and a portion of the second metal multilayer stack at least until that the bottom layer of the first metal multilayer stack is thinned; and
after the removing, filling recesses in the first metal multilayer stack and the second metal multilayer stack with a conductor.

11. The method of claim 10, wherein after the removing, the bottom layer of the second metal multilayer stack is not thinned.

12. The method of claim 10, wherein after the removing, the bottom layer of the first metal multilayer stack and the bottom layer of the second metal multilayer stack have different thicknesses.

13. The method of claim 10, wherein after the removing, the bottom layer of the first metal multilayer stack is thinner than the bottom layer of the second metal multilayer stack.

14. The method of claim 10, further comprising:
forming a third metal multilayer stack over a third semiconductor channel, wherein the third metal multilayer stack is masked during the removing.

15. The method of claim 14, wherein the third metal multilayer stack has layers the same as the second metal multilayer stack in amount.

16. A method of forming a semiconductor device, comprising:
forming a first dummy gate structure and a second dummy gate structure over a substrate;
forming first gate spacers on opposite sidewalls of the first dummy gate structure and second gate spacers on opposite sidewalls of the second dummy gate structure;
removing the first dummy gate structure and the second dummy gate structure to form a first opening between the first gate spacers and a second opening between the second gate spacers;
forming a tantalum nitride layer in the first opening and the second opening;
removing a first portion of the tantalum nitride layer in the first opening; and
after the removing, filling the first opening and the second opening with a conductor.

17. The method of claim 16, wherein a second portion of the tantalum nitride layer in the second opening is not removed.

18. The method of claim 16, wherein after the removing, a second portion of the tantalum nitride layer remaining in the first opening and a third portion of the tantalum nitride layer in the second opening have different thicknesses.

19. The method of claim 16, wherein after the removing, a second portion of the tantalum nitride layer remaining in the first opening is thinner than a third portion of the tantalum nitride layer in the second opening.

20. The method of claim 16, further comprising:
forming a work function layer over the tantalum nitride layer in the first opening and the second opening prior to the removing; and
removing a first portion of the work function layer in the first opening while leaving a second portion of the work function layer in the second opening.

* * * * *